(12) United States Patent
Perez et al.

(10) Patent No.: US 7,296,248 B2
(45) Date of Patent: Nov. 13, 2007

(54) METHOD AND APPARATUS FOR COMPILING A PARAMETERIZED CELL

(75) Inventors: Julia Perez, Tempe, AZ (US); Leo Kasel, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 246 days.

(21) Appl. No.: 11/157,025

(22) Filed: Jun. 20, 2005

(65) Prior Publication Data

US 2006/0288315 A1 Dec. 21, 2006

(51) Int. Cl.
*G06F 17/50* (2006.01)
(52) U.S. Cl. .................. 716/3; 716/1; 716/8; 716/10
(58) Field of Classification Search .............. 716/1, 716/3, 10, 8
See application file for complete search history.

(56) References Cited

U.S. PATENT DOCUMENTS

| | | | |
|---|---|---|---|
| 5,883,814 A * | 3/1999 | Luk et al. .................... 716/2 |
| 5,920,486 A | 7/1999 | Beahm et al. |
| 6,064,806 A | 5/2000 | Lakos et al. |
| 6,121,979 A | 9/2000 | Carver |
| 6,263,339 B1 | 7/2001 | Hirsch |
| 6,493,855 B1 * | 12/2002 | Weiss et al. ............... 716/10 |
| 6,922,659 B2 * | 7/2005 | Karniewicz ................ 703/1 |
| 6,931,606 B1 * | 8/2005 | Kretchmer et al. .......... 716/1 |
| 7,137,079 B2 * | 11/2006 | Luo et al. .................. 716/1 |
| 2004/0060032 A1 * | 3/2004 | McCubbrey ............... 716/16 |

* cited by examiner

*Primary Examiner*—Stacy A. Whitmore
*Assistant Examiner*—Magid Y. Dimyan
(74) *Attorney, Agent, or Firm*—Michael J. Balconi-Lamica

(57) ABSTRACT

A method of generating a parameterized cell is disclosed herein. The method comprises performing a compiling interpretation on a structure layout. The compiling interpretation includes i) determining and analyzing shape relationships of the structure layout, and ii) mapping shapes and calculating properties of mapped shapes. The method also includes generating code in response to the compiling interpretation, wherein the generated code is representative of one or more parameterized cells of a pcell library of an electronic design automation software program.

13 Claims, 6 Drawing Sheets

METHOD AND APPARATUS FOR COMPILING A PARAMETERIZED CELL

BACKGROUND

The present disclosures relate to compiling methods, and more particularly, to a parameterized layout or parameterized cell compiler and a method of compiling a parameterized cell.

Creating parameterized cells (hereinafter referred to as pcells) of a structure layout is a large task with prior known approaches. A structure layout can include, for example, a semiconductor device layout. The prior known approaches are very time intensive and cumbersome to write code for a parameterized cell given that the structure layout can be very complex. For any given library, there may exist on the order of 30-50 devices needing pcells to be created per technology. In addition, there may exist a number of different technologies that are in use concurrently. Furthermore, a number of new technologies can be introduced over a period of time. Accordingly, development and maintaining of a pcell library can be critical for various technology developments and designs.

FIG. 1 is a flow diagram view 10 of a prior known method of generating a parameterized cell. Upon an initiation of the method, at step 12, the compiler receives a structure layout as an input. The structure layout can be in the form of a file, such as a standard graphical design file for transferring and archiving graphical design data (i.e, a gds file). In response to receiving the input at step 12, the process continues at step 14 with a scanning operation. The scanning operation includes scanning of the structure layout for layer and basic coordinate information of shapes within the layout.

In step 16, the method queries whether there are any user added parameters, shape relationships, and/or specifications to be processed. If there are user added parameters, shape relationships, and/or specifications to be processed, the method proceeds to step 18 for adding the same. User added parameters, shape relationships, and/or specifications are associated with shape data as appropriate. The method then proceeds to step 20. On the other hand, if in step 16 there are no user added parameters, shape relationships, and/or specifications to be processed, the method proceeds directly to step 20.

In step 20, responsive to data generated by the scanning operation and optional user added parameters, the method generates code. The generated code includes computer readable instructions, wherein the computer readable instructions define a limited parameterized structure generation algorithm. Thereafter, the method ends.

The method of FIG. 1 suffers from various disadvantages. For example, the method of FIG. 1 does not address scalability. In addition, the shape generation algorithm of the method of FIG. 1 is coordinate based alone, and not easily adaptable to improved parameterization. Still further, the method of FIG. 1 does not provide any interpretation or mapping. As a result, the generated code produced by the method of FIG. 1 is inefficient, making it difficult to maintain and use.

Accordingly, there is a need for an improved method and apparatus for overcoming the problems in the art as discussed above.

SUMMARY

According to one embodiment of the present disclosure, a method of generating a parameterized cell comprises performing a compiling interpretation on a structure layout. The compiling interpretation includes i) determining and analyzing shape relationships of the structure layout, and ii) mapping shapes and calculating properties of mapped shapes. The method also includes generating code in response to the compiling interpretation, wherein the generated code is representative of one or more parameterized cells.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
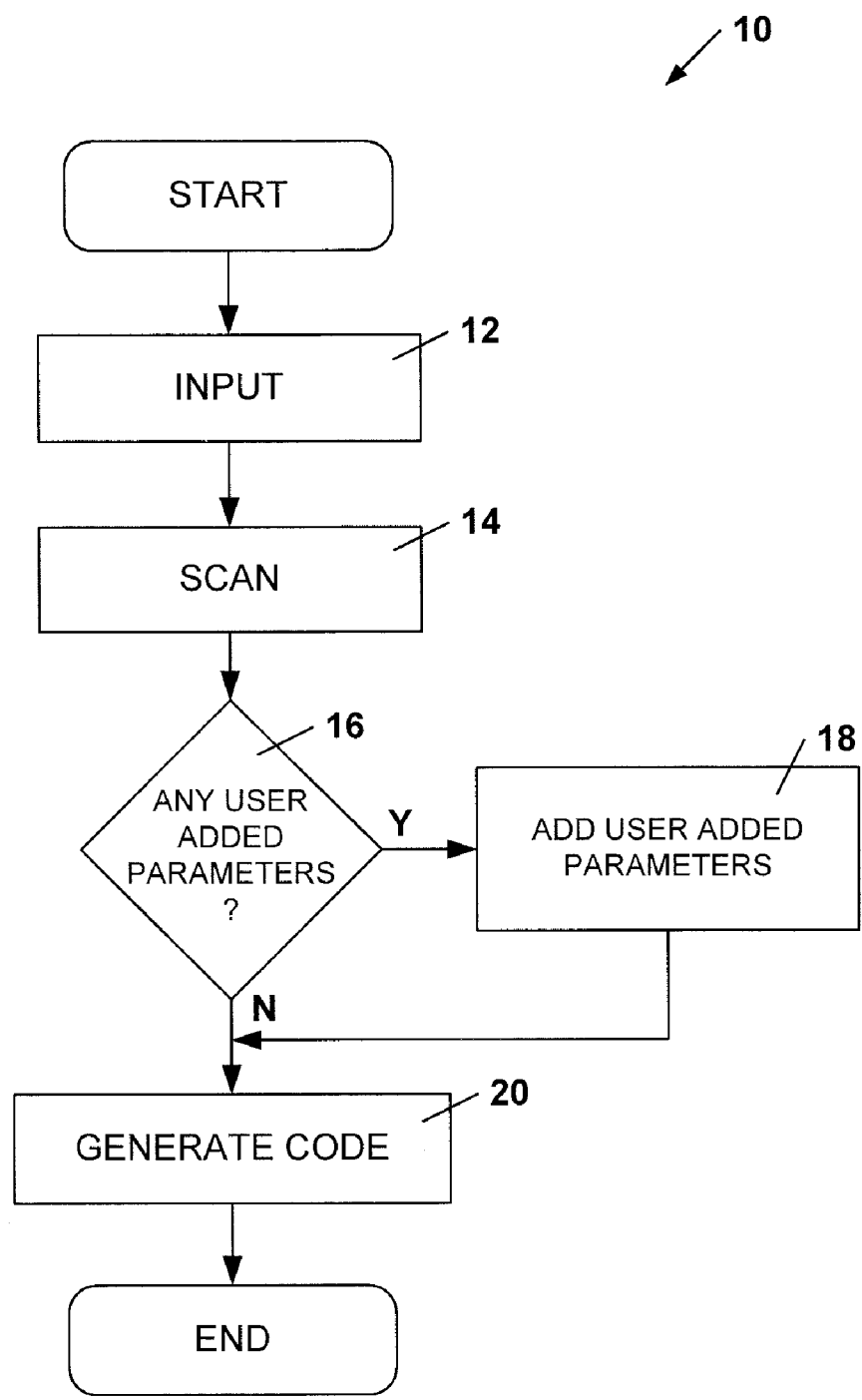
FIG. 1 is a flow diagram view of a prior known method of generating a parameterized cell.
Figure 2:
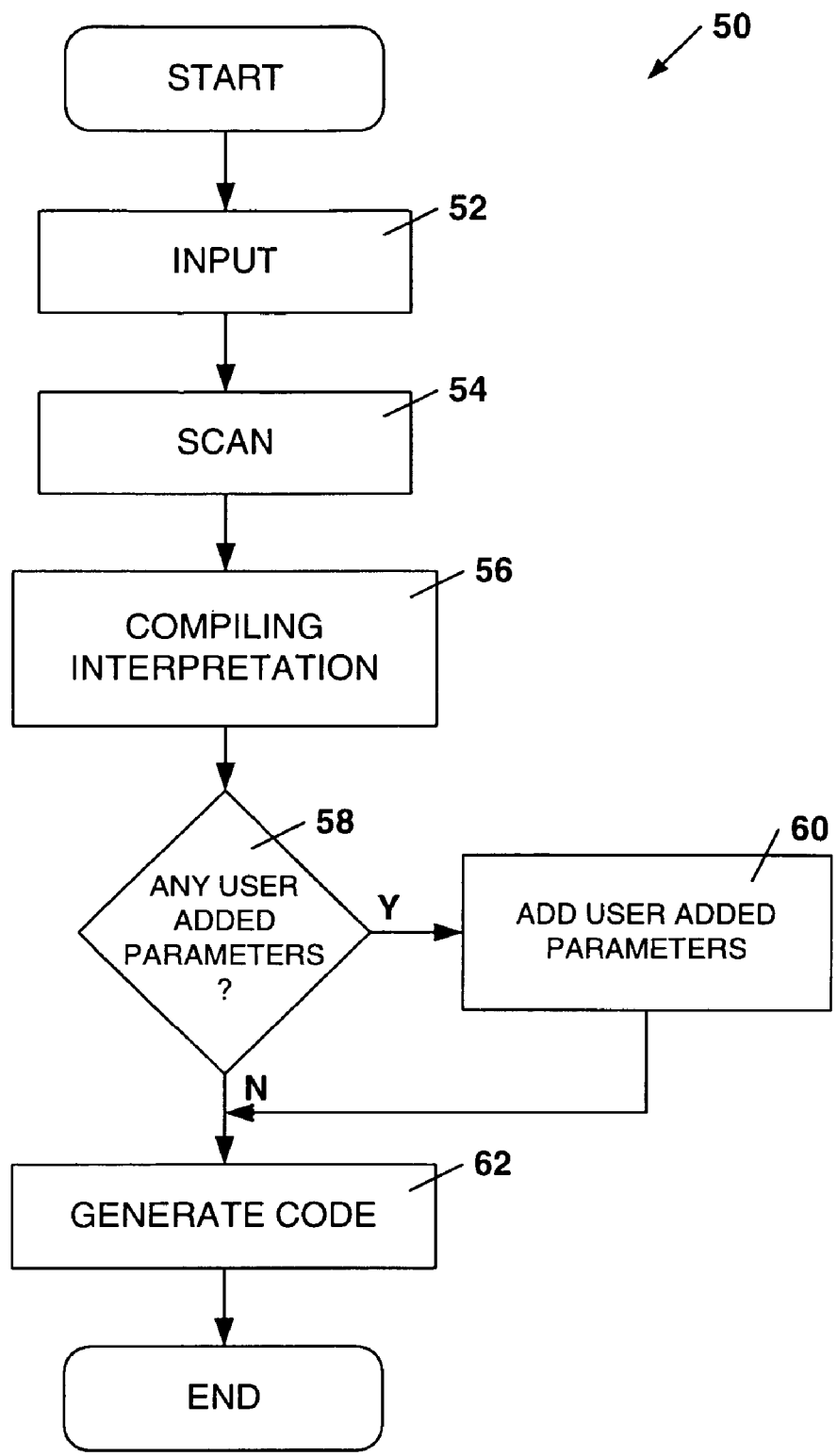
FIG. 2 is a flow diagram view of a method of generating a parameterized cell according to one embodiment of the present disclosure.

FIG. 2 is a flow diagram view 50 of a method of generating a parameterized cell according to the embodiments of the present disclosure. Upon an initiation of the method, at step 52, the compiler accepts and/or receives a structure layout as an input. The structure layout can be in the form of a file, such as a gds file, a descriptive text file, or other type of suitable database file including a structure layout. In addition, the structure layout can include a series of shapes on one or more levels (i.e., can include a multilevel structure). In response to receiving the input at step 52, the process continues at step 54 with a scanning operation. The scanning operation includes scanning of the multi-level structure layout, as derived from the input file, for layer and a prescribed minimum of coordinate information of one or more shapes within the structure layout. The prescribed minimum of coordinate information can include at least a minimum of coordinate information necessary for a given parameterized cell application. The method then continues with a compiling interpretation of the scanned multi-level structure layout in step 56. Step 56 produces ordered compiled data as an output, further as discussed herein below. Subsequent to the compiling interpretation, the method proceeds to a query at step 58.

In step 58, the method queries whether there are any user added parameters and/or specifications to be processed.

More particularly, the user added parameters can include one or more additional parameters to be incorporated into the compiling interpretation prior to generating code. The one or more additional parameters can originate from the structured layout or from a source other than the structure layout. If there are user added parameters and/or specifications to be processed, the method proceeds to step 60 for adding the same. User added parameters and/or specifications are associated with shape data as appropriate. The method then proceeds to step 62. On the other hand, if in step 58 there are no user added parameters and/or specifications to be processed, the method proceeds directly to step 62.

In step 62, responsive to the ordered compiled data (e.g., an ordered compiled listing or tree), and for each shape of the ordered compiled data, the method generates code. The generated code includes instructions stored on a computer readable media and executable by a computer, in any suitable language according to the particular requirements of a given compiling application, wherein the instructions define a programmable, scalable, parameterized structure generation algorithm as a function of the compiling interpretation. Upon completion of the generating code, the process can end, or alternatively, be restarted at any one of various points therein according to the requirements of a given system user.

Figure 3:
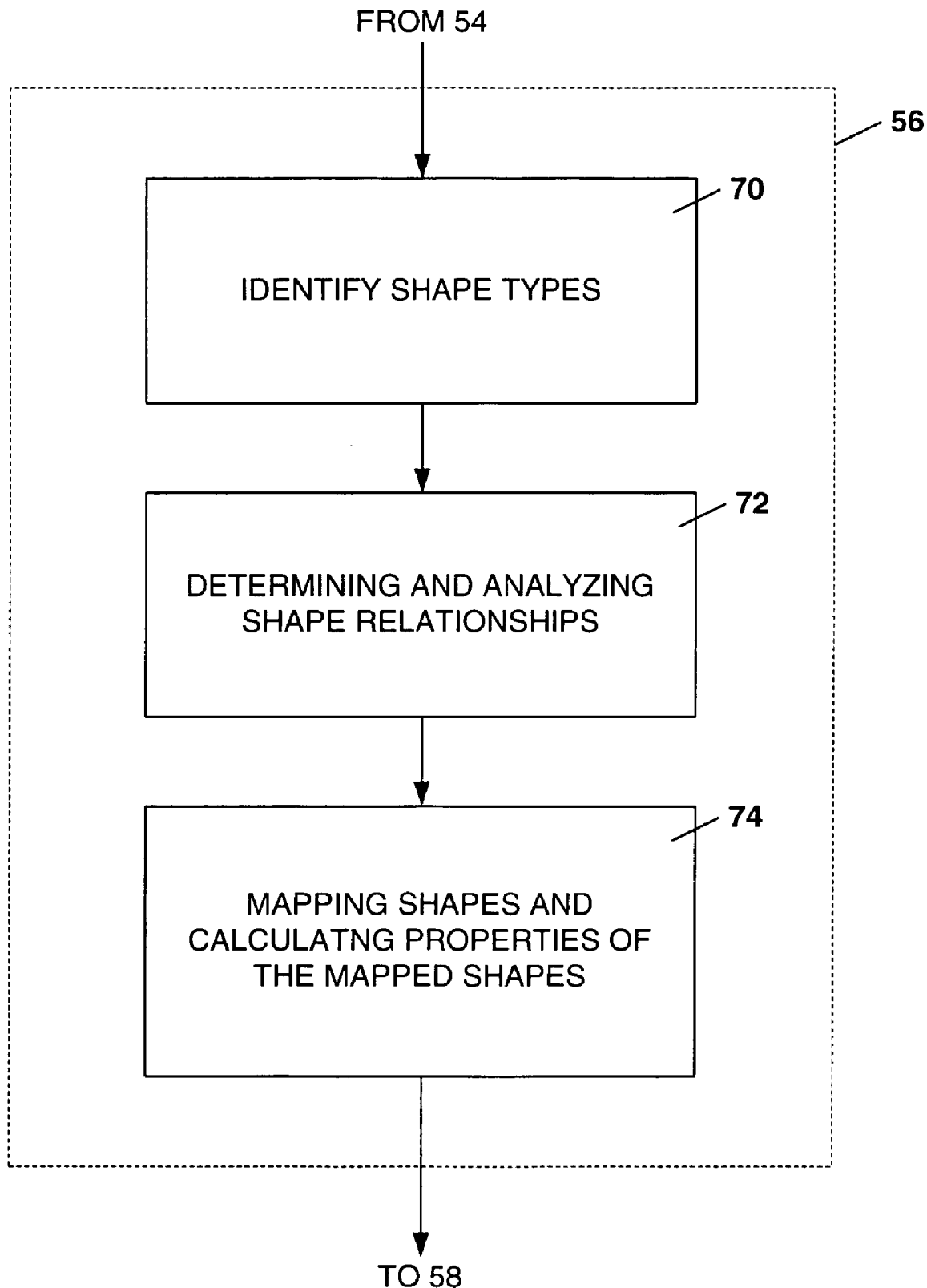
FIG. 3 is a flow diagram view of a compiling interpretation portion of the method of generating a parameterized cell according to one embodiment of the present disclosure.

FIG. 3 is a flow diagram view of a compiling interpretation portion 56 of the method of generating a parameterized cell according to one embodiment of the present disclosure. As discussed above, compiling interpretation 56 of the scanned multi-level structure layout produces ordered compiled data as an output. The compiling interpretation 56 includes identifying shape types 70, determining and analyzing shape relationships 72, and mapping shapes and calculating dimension properties of the mapped shapes 74.

With respect to identifying shape types 70, elements of this portion of the method include identifying features of shapes included within the multi-level structure layout for classifying the shapes to corresponding shape generation functions. For example, one feature could include a rectangular shape having one or more non-square corner(s). Upon identification of such a feature, the shape is then associated with a generation function that is used for generating the rectangle having the one or more non-square corner(s). Other elements of this portion of the method can include optionally classifying sub-shapes. Sub-shapes can include shapes, such as mosaics, one or more arrays of identical shapes, contacts, vias, etc. The sub-shapes can optionally be treated for the purpose of special classification(s) and associations for improving an efficiency of generating parameterized cell code. Special classifications can include classifying a sub-shape to one or more layers, such as, active, metal 1, metal 2, etc. For instance, code generation for arrays of identical shapes can be generated more rapidly if processed as a whole group versus being processed as individual shapes. This illustrates one example of a shape generation function. Further, with respect to determination of the shape type, information (or properties) can be added to the shape itself and stored for later use, along with a unique variable name or identifier. For example, an active layer, ring shape could be identified as "AaRing1", with size dimensions, and corner information, such as round inside corners and square outside corners.

Figure 4:
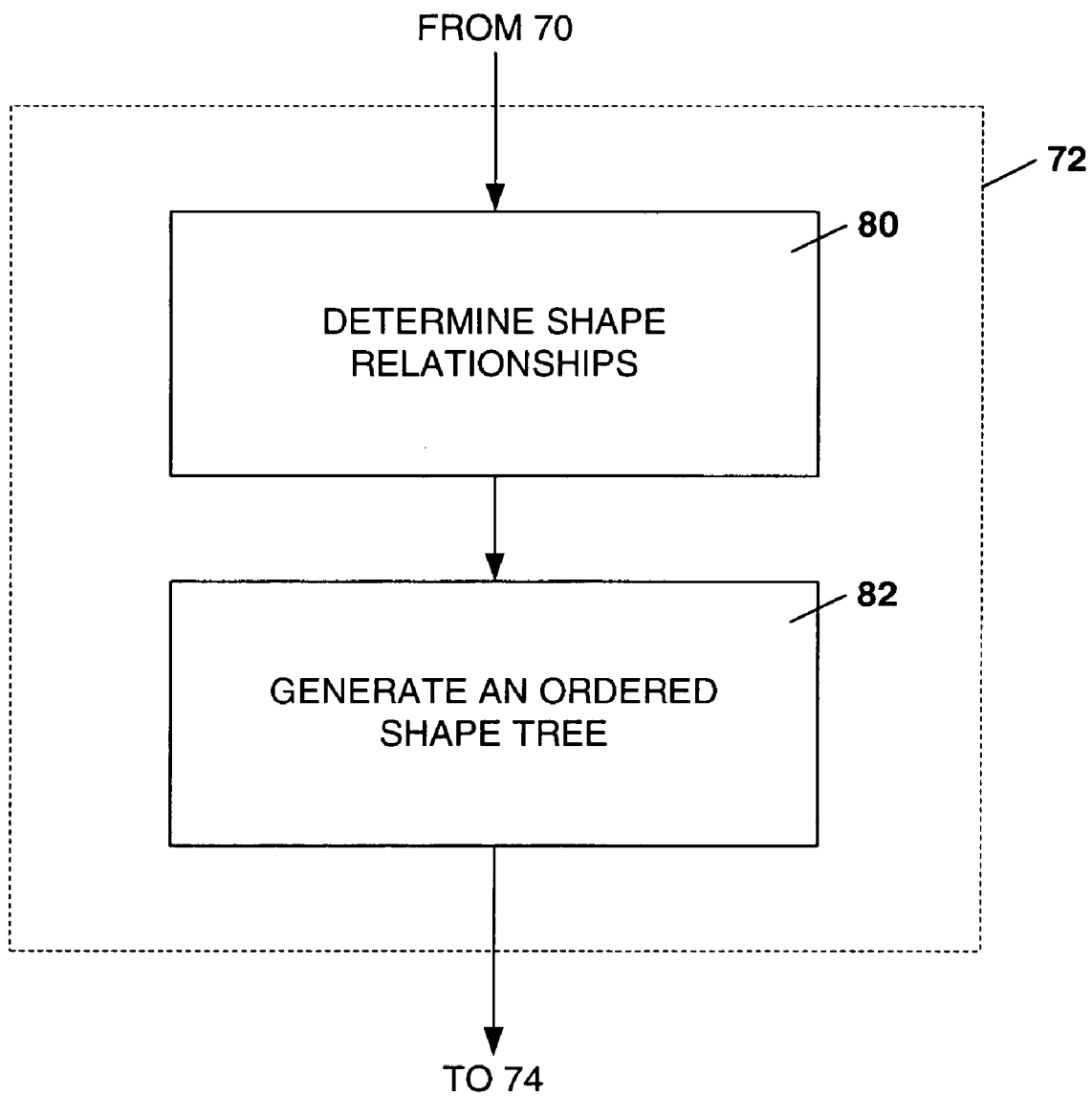
FIG. 4 is a flow diagram view of a determining and analyzing shape relationships portion of the compiling interpretation of FIG. 3.

FIG. 4 is a flow diagram view of a determining and analyzing shape relationships portion 72 of the compiling interpretation 56 of FIG. 3. With respect to determining and analyzing shape relationships 72, this portion of the process includes determining shape relationships 80 and generating an ordered shape tree 82. Determining shape relationships 80 includes comparing shapes to other shapes within the multi-level structure layout. A goal of determining shape relationships includes identifying relative relationships between shapes. For each shape, the relative relationships can include determining: i) a closest overlapping shape, and/or ii) if a shape is adjacent to another shape, then the relative relationship finds a nearest adjacent shape, and/or iii) an optimal reference shape, and/or iv) for each shape, the relative relationship finds any shape that is contained totally within another shape. For any given shape, there may be contained within that shape a number of additional shapes. The number of additional shapes can include one or more shapes, each of which may have a closest overlapping shape, a nearest adjacent shape, and/or may have yet another shape contained within the same. In one instance, identifying a relative relationship can include finding a prescribed shape for being used in scaling of a number of shapes, as well as, establishing links between the shapes.

In other words, with respect to determining and analyzing shape relationships 72, determining and analyzing shape relationships of the structure layout includes determining shape relationships 80 and generating an ordered shape tree 82 based upon the determined shape relationships. Determining shape relationships 80 includes for each shape, comparing the shape to one or more other shapes within the structure layout and identifying one or more relative relationships between shapes. Furthermore, according to one embodiment, for each shape, the one or more relative relationships can include determining one or more selected from the group consisting of: i) a closest overlapping shape, ii) a nearest adjacent shape if the shape is adjacent to another shape, and iii) any shape that is contained totally within the shape. According to a further embodiment, identifying a relative relationship can include finding a prescribed shape suitable for use in one or more of i) scaling of a multiple of shapes and ii) linking between shapes.

Subsequent to the determining the shape relationships in step 80, the generation of an ordered shape tree 82 includes processing the list of shapes identified in step 80. A first shape to be placed in the compile list comprises either i) a user selected shape or ii) a smallest innermost shape contained within the structured layout. Each subsequent shape is then examined for nearest size relative to the first shape and/or in combination with any prescribed shape relationship information determined in step 80, and then ordered according to a particular ordering based upon a prescribed criteria. In addition to the above mentioned criteria, shape types, shape size, spacing and functionalities can also be considerations for placement of shapes in the ordering of the shapes within the compile list. For example, a shape that is subsequently repeated must initially be contained within the ordered compile list prior to an occurrence of the repeating of the shape. In another example, if a shape completely overlaps a smaller shape, then the smaller shape must be placed within the compile list first, prior to the overlapping shape. Other considerations are possible, such as, a first shape being adjacent to a second shape, etc. This ordering contributes to the ease of scalability of a generated parameterized cell, since each shape is generated relative to other shapes according to the given ordering.

Figure 5:
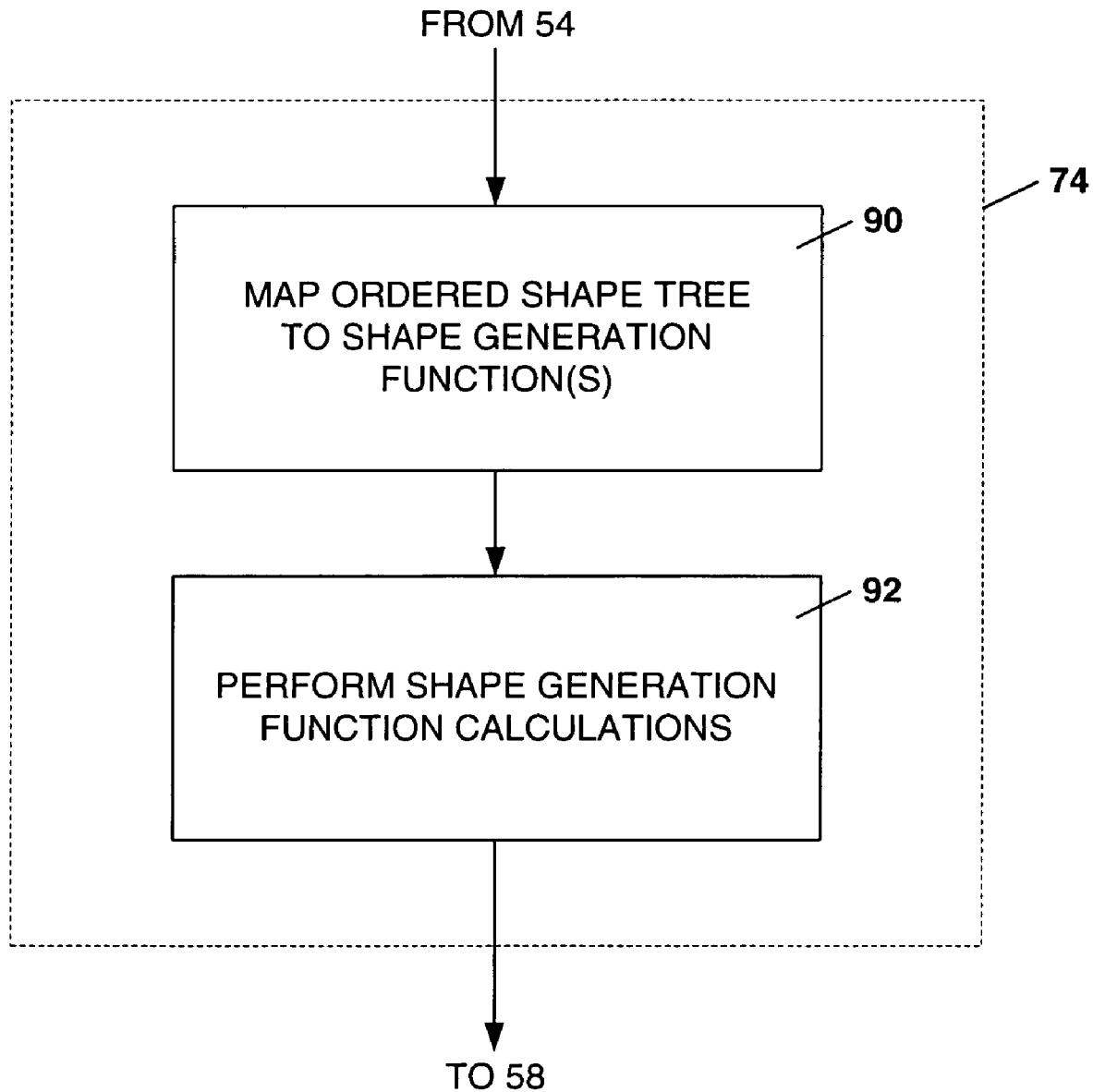
FIG. 5 is a flow diagram view of a mapping shapes and calculating properties of the mapped shapes portion of the compiling interpretation of FIG. 3.

FIG. 5 is a flow diagram view of a mapping shapes and calculating properties of the mapped shapes portion 74 of the compiling interpretation 56 of FIG. 3. With respect to mapping shapes and calculating properties of the mapped shapes 74, this portion of the process includes mapping the ordered shape tree to shape generation function(s) 90 and performing shape generation function calculations 92. Mapping the ordered shape tree to corresponding one or more shape generation function(s) 90 comprises examining each element or item in the compiled shape tree and based upon shape type and relative shape classification, the shape is then matched to a corresponding shape generation function. The parameterized cell embodiment includes shape generation functions in the order that the shape elements appear in the compiled list. In addition, there are optional exceptions for handling of any sub-shapes previously sub-classified in scanning step 54. Sub-shapes can include, for example, mosaic shapes. The mosaic shapes are handled in a different manner, since the mosaic shapes do not appear on the compiled list. In one embodiment, the mosaic shapes are processed after the mapping and printing of the compiled list elements and any repeating shapes that may exist. In this manner, the generated code is more efficient since the mosaic shapes are generated for each repeated shapes as well as the original shape.

Performing shape generation function calculations 92 comprises examining each shape in the compiled list, and based upon the assigned shape generation function, specific dimension calculations are performed. For example, if a shape is determined to be a rectangular shape whose relative shape relationship to another reference shape (or shapes) comprises overlap, then the overlapping values (such as, top, bottom, left, right, etc.) are calculated based upon the actual layout dimensions and stored to appropriate shape generation functions, as well as on the shapes themselves. Storing information on a shape itself can be accomplished using pointers, virtual memory, or other suitable means as may be appropriate for a particular parameterized cell compiler implementation. An optional feature is to have the stored data accessible for user interactive parameterization, for example, setting calculated dimensions to user defined parameters, such as, shape dimensions and dimensions between shapes, or making other user changes.

In other words, with respect to mapping shapes and calculating properties of the mapped shapes 74, in one embodiment, mapping shapes includes mapping the ordered shape tree into one or more shape generation functions 90, corresponding to a compiled shape tree. In addition, calculating properties of mapped shapes can include performing shape generation function calculations 92. Furthermore, in another embodiment, mapping the ordered shape tree into one or more shape generation functions 90 further comprises generating a compiled list by (i) examining each shape in the ordered shape tree and (ii) assigning the corresponding shape to a shape generation function based upon a shape type and a relative shape classification of the shape.

Upon completion of the mapping and performing functions of steps 90 and 92, the parameterized cell compiler is configured to subsequently generate the parameterized cell code at step 62 of FIG. 2. In one embodiment, code generation considerations include programming language specific format, code generated comment information, and shape generation functions in the prescribed order of the compiled list, or any combination of the same. For example, the generated code can comprise instructions stored on a computer readable media and executable by a computer for defining a programmable, scalable, parameterized structure generation algorithm as a function of the compiling interpretation. In addition, the various functions of the embodiments of the present disclosure, as discussed herein and illustrated via the flow diagrams, can be programmed using programming techniques known in the art.

Figure 6:
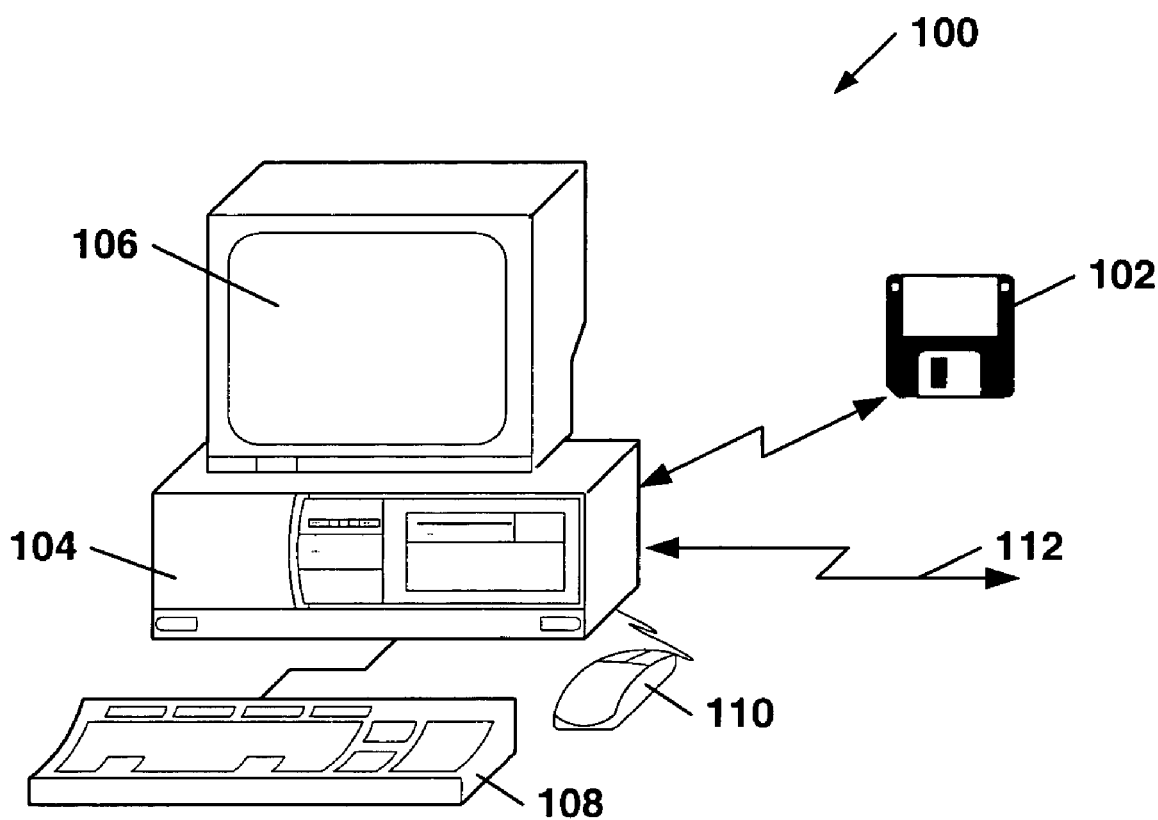
FIG. 6 is a system block diagram view of a parameterized cell compiler according to another embodiment of the present disclosure.

FIG. 6 is a system block diagram view of a parameterized cell compiler 100 according to another embodiment of the present disclosure. Parameterized cell compiler 100 includes a computer readable media 102, a computer 104, display 106, input/output device 108 (such as a keyboard, or the like), and pointer device 110 (such as a mouse, or the like). Parameterized cell compiler 100 can comprise any suitable information handling system configured for carrying out the method of generating a parameterized cell as discussed herein.

Computer readable media 102 includes computer readable instructions for being processed by computer 104 for generating a parameterized cell according to the embodiments of the present disclosure. Graphical user interfaces (GUIs) are utilized in connection with display 106, as may be appropriate, throughout the process of generating a parameterized cell for the obtaining of desired user inputs. User inputs can be obtained via input/output device 108 and/or pointer device 110. In addition to computer readable media 102, more than one computer readable media may be used, for example, computer readable media 112. In one embodiment, computer readable media 112 can include a network connection, such as, an internet, intranet, or other suitable connection.

In the foregoing specification, the disclosure has been described with reference to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, one embodiment of the present disclosure can include the handling of non-standard or unrecognized shapes. The embodiments of the present disclosure can further include the handling of the repeating of an entire structured layout or a portion of the entire structured layout. The embodiments of the present disclosure still further can comprise the use of one or more variables in place of calculated dimension values. The embodiments of the present disclosure can also provide benefits for semiconductor process development in which an extensive number of device variations are generally needed to test and model new semiconductor processes. For example, one benefit can include a shortened cycle time in one or more phases of new technology development and design starts. Accordingly, the embodiments of the present disclosure address parameterization, interpretation of shapes of a structural layout with minimal intervention by a user, and maps the interpreted shapes to shape generation functions and/or generates a reusable/editable parameterized executable file as may be stored in, and used from, any library of an electronic design automation software program.

Benefits, other advantages, and solutions to problems have been described above with regard to specific embodiments. For example, in one embodiment, the generated pcell code shortens a cycle time which positively impacts new technology development and design starts. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of generating a parameterized cell of a semiconductor device layout, comprising:

performing a compiling interpretation on a structure layout of a semiconductor device, wherein the compiling interpretation includes i) determining and analyzing shape relationships of the structure layout, and ii) mapping shapes and calculating properties of mapped shapes; and generating code in response to the compiling interpretation, wherein the generated code is representative of one or more parameterized cells of a pcell library of an electronic design automation software program and further for semiconductor process development in which a number of device variations are used to test and model new semiconductor processes, wherein determining and analyzing shape relationships of the structure layout includes determining shape relationships and generating an ordered shape tree based upon the determined shape relationships, wherein determining shape relationships includes for each shape, comparing the shape to one or more other shapes within the structure layout and identifying one or more relative relationships between shapes.

2. The method of claim 1, further wherein for each shape, the one or more relative relationships include determining one or more selected from the group consisting of: i) a closest overlapping shape, ii) a nearest adjacent shape if the shape is adjacent to another shape, and iii) any shape that is contained totally within the shape.

3. The method of claim 2, further including identifying a relative relationship by finding a prescribed shape suitable for use in one or more of i) scaling of a multiple of shapes and ii) linking between shapes.

4. The method of claim 1, wherein mapping shapes includes mapping the ordered shape tree into one or more shape generation functions, corresponding to a compiled shape tree, and wherein calculating properties of mapped shapes includes performing shape generation function calculations.

5. The method of claim 4, wherein mapping the ordered shape tree into one or more shape generation functions further comprises generating a compiled list by (i) examining each shape in the ordered shape tree and (ii) assigning a corresponding shape of the ordered shape tree to a shape generation function based upon a shape type and a relative shape classification of the shape.

6. The method of claim 5, further wherein performing shape generation function calculations comprises, for each shape in the compiled list, performing prescribed dimension calculations based upon an assigned shape generation function.

7. The method of claim 6, wherein responsive to an occurrence of a relative shape relationship that includes overlap of one shape to one or more other shapes, then the performing of the prescribed dimension calculations further includes calculating overlapping dimension values based upon actual layout dimensions and storing the actual layout dimensions corresponding to appropriate shape generation functions, wherein the overlapping dimension values can include one or more of top, bottom, left, or right dimensions.

8. The method of claim 1, further comprising:

scanning the structure layout prior to performing the compiling interpretation, wherein scanning of the structure layout includes scanning for (i) layer information and (ii) a prescribed minimum of coordinate information for one or more shapes within the structure layout.

9. The method of claim 1, further comprising:

incorporating one or more additional parameters into the compiling interpretation prior to generating code, wherein the one or more additional parameters originate from the structure layout or from a source other than the structure layout.

10. The method of claim 9, wherein the one or more additional parameters include user added parameters.

11. A computer program product comprising instructions stored on a computer readable media and executable by a computer, the instructions for carrying out the method of generating a parameterized cell according to claim 1.

12. A parameterized cell compiler configured for performing the method of claim 1.

13. A method of generating a parameterized cell of a semiconductor device layout, comprising:

performing a compiling interpretation on a structure layout of a semiconductor device, wherein the compiling interpretation includes i) determining and analyzing shape relationships of the structure layout, and ii) mapping shapes and calculating properties of mapped shapes; and generating code in response to the compiling interpretation, wherein the generated code is representative of one or more parameterized cells of a pcell library of an electronic design automation software program and further for semiconductor process development in which a number of device variations are used to test and model new semiconductor processes, wherein determining and analyzing shape relationships of the structure layout includes determining shape relationships and generating an ordered shape tree based upon the determined shape relationships, wherein determining shape relationships includes for each shape, comparing the shape to one or more other shapes within the structure layout and identifying one or more relative relationships between shapes, further wherein for each shape, the one or more relative relationships include determining one or more selected from the group consisting of: i) a closest overlapping shape, ii) a nearest adjacent shape if the shape is adjacent to another shape, and iii) any shape that is contained totally within the shape, wherein mapping shapes includes mapping the ordered shape tree into one or more shape generation functions, corresponding to a compiled shape tree, and wherein calculating properties of mapped shapes includes performing shape generation function calculations, and wherein mapping the ordered shape tree into one or more shape generation functions further comprises generating a compiled list by (i) examining each shape in the ordered shape tree and (ii) assigning the corresponding shape to a shape generation function based upon a shape type and a relative shape classification of the shape.

* * * * *